US005650460A

United States Patent [19]
Jacobs

[11] Patent Number: 5,650,460
[45] Date of Patent: *Jul. 22, 1997

[54] FAST BONDING ELECTRICALLY CONDUCTIVE COMPOSITION AND STRUCTURES

[76] Inventor: Richard Jacobs, 1630 Fiske Pl., Oxnard, Calif. 93030

[*] Notice: The term of this patent shall not extend beyond the expiration date of Pat. No. 5,451,629.

[21] Appl. No.: 526,973

[22] Filed: Sep. 12, 1995

Related U.S. Application Data

[63] Continuation of Ser. No. 234,328, Apr. 28, 1994, Pat. No. 5,451,629, and Ser. No. 173,242, Dec. 23, 1993, Pat. No. 5,504,138, which is a continuation of Ser. No. 669,743, Mar. 12, 1991, abandoned.

[51] Int. Cl.$^6$ .............................. C08K 3/10; H01B 1/02; C08G 18/32
[52] U.S. Cl. .................. 524/440; 524/780; 528/74.5; 528/77; 252/512; 252/514
[58] Field of Search .................................. 252/500, 502, 252/511, 521, 514, 182.2; 524/439, 495, 496, 310, 440; 528/59, 60, 65, 76, 77, 48, 49

[56] References Cited

U.S. PATENT DOCUMENTS

| Re. 33,761 | 12/1991 | Brauer et al. | 524/310 |
|---|---|---|---|
| 4,931,479 | 6/1990 | Morgan | 521/76 |
| 5,061,566 | 10/1991 | Morgan | 524/435 |
| 5,164,473 | 11/1992 | Dormish et al. | 528/44 |
| 5,284,888 | 2/1994 | Morgan | 524/93 |
| 5,385,966 | 1/1995 | Hermansen et al. | 524/426 |
| 5,451,629 | 9/1995 | Jacobs | 524/495 |

*Primary Examiner*—Tae Yoon
*Attorney, Agent, or Firm*—Louis J. Bachand

[57] ABSTRACT

Composition and method for a conductive interconnection composition in bonding relation with electronic components including combining and upon combining expressing from a mix tip onto conductive portions of electronic components a silver filled first side urethane resin precursor comprising an aliphatic isocyanato reagent and a silver filled second side urethane resin precursor comprising a polyol reagent immediately reactive with the first side precursor isocyanato reagent, the silver being present in the composition in an amount sufficient to conduct electricity to and from the electronic components.

21 Claims, No Drawings

FAST BONDING ELECTRICALLY CONDUCTIVE COMPOSITION AND STRUCTURES

REFERENCE TO RELATED APPLICATIONS

This application is a continuation of my application Ser. No. 08/234,328 filed Apr. 28, 1994, now U.S. Pat. No. 5,451,629, and is further a continuation in part of my application Ser. No. 08/173,242, filed Dec. 23, 1993, now U.S. Pat. No. 5,504,138 which in turn is a continuation in part of application Ser. No. 07/669,743, filed Mar. 12, 1991, now abandoned. The disclosures of these applications are incorporated herein by this reference.

FIELD OF THE INVENTION

This invention has to do with compositions useful in electronic assembly such as in circuit boards and like arrangements of various electrical components, including integrated circuit components, transistors, resistors, rectifiers, capacitors, quad flat packs and multichip modules having current or magnetic flux carrying, storing or modifying capability, and conductive paths and wiring therebetween, supported in a predetermined configuration for performance of electronic, electrical and other physical functions, which assemblies when partially or completely electrically interconnected by means of the invention compositions are hereinafter sometimes referred to as electronic structures. More particularly, the invention relates to electrically conductive compositions which are free of tin and lead and other toxic elements, and which can substitute therefor in many interconnection applications where high conductivity is required.

In a particular aspect, the invention provides the first feasible substitute for conventional lead/tin solders in highly demanding applications such as circuit board manufacture, by affording ease of precise application volume and location, high speeds of set-up to a permanent interconnection of the electrical components, and a commercially useful shelf-life.

In another aspect, the invention is concerned with A-side or first side, and B-side, or second side, type urethane compositions which are highly conductive, readily adherent to a variety of conductive and non-conductive materials, reactive upon application in situ, and in short and very short time periods, e.g. 30 seconds to 3 minutes, to be usable for replacement of solder welds in many electronic structure applications, such as circuit boards.

BACKGROUND

The securement of permanent conductive contact between electrical components without the use of toxic elements is a high priority in circuit board manufacture and other electronic structure assembly operations. Requirements of a successful material for such applications include high conductivity, rapid adhesion where applied, achievement of a stable physical state in moments, and consistent results every time used.

SUMMARY OF THE INVENTION

Urethane polymers filled with conductive particles such as finely divided copper, aluminum and silver, or carbon, have been found to provide a conductive composition which is adherent to metal and to other substrates including epoxy-impregnated glass fiber circuit boards. In the most demanding applications, silver flake is the filler of choice, at loadings of from 60 to 92 per cent by weight, and preferably from 70 to 80 per cent by weight. In addition to good conductivity and adhesion, a sufficiently quick acting resin to permit apply-and-hold application of the conductive composition is required and for this purpose the invention uses certain urethane polymers which have the requisite physical properties.

Not all urethane polymers, however, are satisfactory since the presence of high loadings of metal, particularly silver, may induce premature reaction of one side or the other of the urethane polymer precursors, limiting shelf life, i.e. shelf-stability, and thus the practical utility of the conductive composition.

It is an object of the invention therefore to provide new compositions of urethane polymers filled with finely divided, e.g. flake or particulate, electrically conductive particles of preferably conductive metal. It is another object to provide a conductive urethane polymer composition which is rapid reacting in situ for conductively interconnecting electronic components. It is a still further object to provide a synthetic resin solder for conductive interconnection of electronic components capable of application from dual dispensing cartridges for immediate reaction to a thermoset polymer having nearly the conductivity of the conductive filler, such as silver.

These and other objects of the invention to become apparent hereinafter are realized in accordance with the invention in the composition comprising an aliphatic isocyanate-amine urethane and conductive filler. Aromatic isocyanate precursors to urethanes have been found reactive with silver conductive filler, shortening the shelf life of the precursor and adversely affecting subsequent preparation of the urethane polymer composition. On the other hand, use of an aliphatic isocyanate reagent with a polyol reagent will produce a suitable urethane composition and without a premature reaction in the isocyanate precursor which limits its shelf life.

In particular, the invention provides a fast bonding, shelf-stable composition for the rapid, conductive interconnection of electronic components comprising finely divided electrically conductive metal intimately distributed through both a first side urethane resin precursor comprising an aliphatic isocyanato reagent and intimately distributed through a second side urethane resin precursor comprising a polyol reagent immediately reactive with the first side precursor isocyanato reagent upon intermixing of the first and second precursors, the metal being present in the composition in an amount sufficient to conduct electricity. In this and like embodiments, preferably, the conductive flake or particles of particularly metal is present in an amount of from 60% to 92% by weight; the metal is silver flake; the silver is present in an amount from 70 to 80% by weight; the first side precursor isocyanato reagent comprises an aliphatic diisocyanate; the aliphatic diisocyanate comprises an isocyanate disubstituted alkyl, alkylene, cycloalkyl or cycloalkylene moiety having from 4 to 18 carbon atoms; the aliphatic diisocyanate comprises methylene dicyclohexane diisocyanate, or the aliphatic diisocyanate comprises isophorone diisocyanate; the isocyanato reagent further comprises a hydrophobic organic polyfunctional active hydrogen moiety; the hydrophobic organic polyfunctional active hydrogen moiety comprises a hydroxyl-, thiol-, or carboxyl-polysubstituted compound reactive with isocyanate groups; the hydrophobic organic polyfunctional active hydrogen moiety comprises, castor oil or hydroxylated glyceryltririnicoleate triester reagent reactive with isocyanate; the aliphatic diisocyanate is present in an amount from 20 to 30 weight per cent, the hydrophobic organic polyfunctional active hydrogen moiety from 2 to 10 weight per cent, and the silver from 70 to 80 weight per cent; the second side precursor polyol reagent comprises a hydroxylated tertiary amine; the hydroxylated tertiary amine comprises N'N'N'N'-tetrakis(2-hydroxyethyl or propyl) ethylene diamine; the second side precursor polyol reagent further comprises an aromatic diamine; the second side precursor polyol reagent further comprises a hydrophobic organic polyfunctional active hydrogen moiety; the hydrophobic organic polyfunctional active hydrogen moiety comprises a hydroxyl-, thiol-, or carboxyl-polysubstituted compound reactive with isocyanate groups; the hydrophobic organic polyfunctional active hydrogen moiety comprises, castor oil or hydroxylated glyceryltriricinoleate triester reagent reactive with isocyanate; the N'N'N'N'-tetrakis(2-hydroxyethyl or propyl) ethylenediamine is present in an amount from 6 to 12 weight per cent, the aromatic amine is present in an amount from 5 to 10 weight per cent, and the silver is present in an amount from 70 to 80 weight per cent; and the second side polyol precursor reagent further comprises from 0.3 to 4 weight per cent organic metal salt urethane polymerization catalyst.

The invention further contemplates the method of preparing a conductive interconnection composition in bonding relation with electronic components including combining and upon combining expressing from a mix tip onto conductive portions of the electronic components to be electrically connected a silver filled first side urethane resin precursor comprising an aliphatic isocyanato reagent and a silver filled second side urethane resin precursor comprising a polyol reagent immediately reactive with the first side precursor isocyanato reagent, the silver being present in the composition in an amount sufficient to conduct electricity to and from the electronic components. In particular embodiments, the method further includes as the first side an isocyanato reagent comprising methylene dicyclohexane diisocyanate containing from 70 to 80 weight per cent silver, and selecting as the second side a polyol reagent comprising N'N'N'N'-tetrakis(2-hydroxyethyl or propyl)ethylene diamine containing from 70 to 80 weight per cent silver, or selecting as the first side an isocyanate reagent comprising methylene dicyclohexane diisocyanate and a hydrophobic organic polyfunctional active hydrogen moiety comprising, castor oil or hydroxylated glyceryltriricinoleate triester reagent, and as the second side a polyol reagent comprising N'N'N'N'-tetrakis(2-hydroxyethyl or propyl)ethylene diamine and a hydrophobic organic polyfunctional active hydrogen moiety comprising, castor oil or hydroxylated glyceryltriricinoleate triester reagent, the first and second sides each containing from 70 to 80 weight per cent silver.

In a further embodiment, the invention provides an electronic structure comprising an assembly of electrically interconnected electronic components, the electronic components being jointly bonded to each other and to the electrically conductive composition in electrically conductive interconnecting relation, the composition comprising an electrically conducting amount of finely divided silver and a polymer having repeating aliphatic isocyanate urethane linkages.

The invention further provides a method of manufacture of electronic structures such as electronic component assemblies including juxtaposing two or more electronic components in supported relation, and electrically interconnecting the electronic components with a conductive composition comprising an electrically conducting amount of finely divided silver and a polymer having repeating aliphatic isocyanate urethane linkages.

DETAILED DESCRIPTION

It has been discovered that fast bonding, shelf-stable conductive compositions that are useful to replace conventional solder in electronic assembly are realized by using an aliphatic urethane polymer filled with a high loading of conductive particulates, i.e. particles or flake, e.g. of silver, particularly silver flake, at loadings of from 62 to 90 per cent by weight, preferably from 70 to 80 per cent by weight, based on the total weight of the composition.

Aliphatic diisocyanates, rather than the more common aromatic diisocyanates, are useful in providing the appropriate reaction time, from 30 seconds to 3 minutes after application, and more importantly, having minimum reaction in the unapplied or stored state, so that the product has a practical shelf life enabling shelf storage for many months before use. The fast reaction time is essential to automated application of the conductive compositions e.g. in circuit board manufacture.

The present conductive compositions lend themselves to application by means of dual cartridge dispensers, e.g. those described in my U.S. Pat. No. 4,869,400 wherein a first side reagent is combined with and intimately mixed with a second side reagent by expressing the two sides separately from side-by-side cartridges into a common manifold, through a mix tip (a complexly baffled tube) and thence out onto the situs of application, e.g. the connection of electronic component leads to wiring or other leads. Other modes of application can be used.

The invention composition first side is an isocyanato reagent and comprises an aliphatic diisocyanate, described above, and preferably a hydrophobic organic polyfunctional active hydrogen moiety such as those listed above in the relative amounts indicated. The first side further includes the loading of conductive metal, copper, silver, gold or aluminum, or carbon. The first side further may include a thixotroping agent and silica filler in small, but effective amounts to provide the desired flow and viscosity characteristics.

The invention composition second side is a polyol reagent having an active hydrogen reactive with isocyanate. This reagent may be any of the previously known polyols reactive with isocyanate, e.g. those enumerated in my earlier U.S. Pat. Nos. 4,689,400 and 5,252,697, whose disclosures are incorporated by this reference, provided speed of reaction, strength of bond and shelf stability are retained adequate to the electronic component bonding application described herein.

The invention is illustrated by the following Examples in which all parts and percentages are by weight.

EXAMPLE

The composition first side was prepared by mixing 24 parts of methylene dicyclohexane diisocyanate (dicyclohexylmethylene diisocyanate; Desmodur W) with 4 parts of castor oil (D. B. Oil ex Caschem) in a closed reactor under vacuum with slow agitation. One part thixotroping agent (Thixatrol ST) and 1.5 parts of fumed silica (Cabosil M5) were added to the mixture and the agitation speed increased. After these materials were thoroughly mixed, 75 parts of flake silver (Silflake 135) was added under mixing agitation until the silver was folded in, to a total of 105 parts. The first side material was packaged in dispenser cartridges.

The composition second side was prepared by combining castor oil (D. B. oil, ex Caschem), 14 parts, with 3,5-diethyltoluene diamine, 7 parts, under vacuum, with agitation. N'N'N'N'-tetrakis(2-hydroxy or propyl)ethylenediamine (Quadrol ex BASF Wyandotte), 9 parts, thixotroping agent (Thixatrol), 1 part, and silica (Cabosil M5) 1.5 parts, were added and the mixture agitated for 30 minutes. During agitation, flaked silver (Silflake 135) was added and folded in for 30 minutes. When mixture was thoroughly mixed, organo-metallic catalyst, bismuth napthenate (Coscat 83), 0.5 part, was added; mixing was continued for a further 30 minutes. The second material was put up in dispenser cartridges.

The first and second side dispenser cartridges were mounted to a dual dispenser having a common manifold and a mix tip. A circuit board blank with a pair of integrated circuits mounted thereto and a conductive line between them were electrically coupled by dispensing the cartridge contents in equal volumes jointly, mixed by the mix tip, onto the IC leads juxtaposed with the conductive line. The resin was fluid in emerging from the mix tip and flowed easily onto the bond situs defined by the junction of the conductive line and the IC lead. The dispensed resin, however, quickly stopped flowing and stayed on the situs. In three minutes the resin was cured so as to be unyielding, and it had firmly bonded the conductive line and IC lead together. An increase in catalyst e.g. to 2 parts, will reduce the cure time to 30 seconds. Conductivity of the bond was confirmed by passing a current between the conductive line and the IC. Typical conductivity values are above 3 mhos.

The foregoing objects of providing new compositions of urethane polymers filled with finely divided, e.g. flake or particulate, electrically conductive particles of preferably conductive metal, which are rapid reacting in situ for conductively interconnecting electronic components are thus met.

I claim:

1. Shelf-stable composition for the rapid, conductive interconnection of electronic components comprising finely divided electrical conductor intimately distributed through both a first side urethane resin precursor comprising an aliphatic isocyanato reagent comprising an aliphatic isocyanate and a hydrophobic organic polyfunctional active hydrogen moiety, and through a second side urethane resin precursor comprising a castor oil reagent immediately reactive with said first side precursor isocyanato reagent upon intermixing of said first and second precursors, said conductor being present in said composition in an amount from 60% to 92% by weight sufficient to conduct electricity.

2. Shelf-stable conductive interconnection composition according to claim 1, in which said conductor is silver.

3. Shelf-stable conductive interconnection composition according to claim 2, in which said silver is present in an amount from 70 to 80% by weight.

4. Shelf-stable conductive interconnection composition according to claim 1, in which said first side aliphatic isocyanate comprises an aliphatic diisocyanate.

5. Shelf-stable conductive interconnection composition according to claim 4, in which said aliphatic diisocyanate comprises an isocyanate disubstituted alkyl, alkylene, cycloalkyl or cycloalkylene moiety having from 4 to 18 carbon atoms.

6. Shelf-stable conductive interconnection composition according to claim 5, in which said aliphatic diisocyanate comprises methylene dicyclohexane diisocyanate.

7. Shelf-stable conductive interconnection composition according to claim 5, in which said aliphatic diisocyanate comprises isophorone diisocyanate.

8. Shelf-stable conductive interconnection composition according to claim 1, in which said hydrophobic organic polyfunctional active hydrogen moiety comprises a hydroxyl-, thiol-, or carboxyl- polysubstituted compound reactive with isocyanate groups.

9. Shelf stable conductive interconnection composition according to claim 8, in which said hydrophobic organic polyfunctional active hydrogen moiety comprises castor oil or hydroxylated glyceryltriricinoleate triester reagent reactive with isocyanate.

10. Shelf-stable conductive interconnection composition according to claim 9, in which said aliphatic diisocyanate is present in an amount from 20 to 30 weight per cent, said hydrophobic organic polyfunctional active hydrogen moiety from 2 to 10 weight per cent, and said silver from 70 to 80 weight per cent.

11. Shelf-stable conductive interconnection composition according to claim 2, in which said second side precursor castor oil reagent further comprises an aromatic diamine.

12. Shelf-stable conductive interconnection composition according to claim 11, in which said aromatic diamine comprises 3,5 diethyl-toluene diamine.

13. Shelf-stable conductive interconnection composition according to claim 2, in which said second side precursor castor oil reagent comprises hydroxylated glyceryltririnoleate triester.

14. Shelf-stable conductive interconnection composition according to claim 2, in which second side precursor castor oil reagent comprises castor oil as a first hydrophobic organic polyfunctional active hydrogen moiety and further comprises a second, hydrophobic organic polyfunctional active hydrogen moiety.

15. Shelf-stable conductive interconnection composition according to claim 14, in which said second hydrophobic organic polyfunctional active hydrogen moiety comprises a hydroxyl-, thiol-, or carboxyl- polysubstituted compound reactive with isocyanate groups.

16. Shelf-stable conductive interconnection composition according to claim 15, in which said second side castor oil precursor reagent further comprises from 0.3 to 4 weight per cent organic metal salt urethane polymerization catalyst.

17. Method of preparing a conductive interconnection composition in bonding relation with electronic components including combining and upon combining expressing from a mix tip onto conductive portions of said electronic components a silver filled first side urethane resin precursor comprising an aliphatic isocyanato reagent and a silver filled second side urethane resin precursor comprising a castor oil reagent immediately reactive with said first side precursor isocyanato reagent, said silver being present in said composition in an amount sufficient to conduct electricity to and from said electronic components.

18. The method according to claim 17, including also selecting as said first side an isocyanato reagent comprising methylene dicyclohexane diisocyanate and containing from 70 to 80 weight per cent silver, and selecting as said second side a reagent comprising castor oil and containing from 70 to 80 weight per cent silver.

19. The method according to claim 17, including also selecting as said first side an isocyanate reagent comprising methylene diisocyanate and castor oil or hydroxylated glyceryltriricinoleate triester reagent, and as said second side a reagent comprising a hydrophobic organic polyfunctional active hydrogen moiety comprising 3,5 diethyl-toluene diamine and castor oil or hydroxylated glyceryltriricinoleate triester reagent, said first and second side each containing silver to provide 70 to 80 weight per cent silver in said composition.

20. An assembly of electrically interconnected electronic components comprising said electronic components and an electrically conductive composition jointly bonded to said electronic components in conductive interconnecting relation, said composition comprising an electrically conducting amount of finely divided silver and the polymer composition of claim 1.

21. The method of manufacture of electronic component assemblies including juxtaposing two or more electronic components in supported relation, and electrically interconnecting said electronic components with a conductive composition comprising an electrically conducting amount of finely divided silver and the polymer composition of claim 1.

* * * * *